(12) United States Patent
Sterzer et al.

(10) Patent No.: US 7,248,196 B1
(45) Date of Patent: Jul. 24, 2007

(54) ANALOG-TO-DIGITAL CONVERTERS EMPLOYING CASCADED PHASE-REVERSING SWITCHES

(75) Inventors: Fred Sterzer, Lawrence Township, Mercer County, NJ (US); Daniel D. Mawhinney, Livingston, NJ (US)

(73) Assignee: MMTC, Inc., Princeton, NJ (US)

( * ) Notice: Subject to any disclaimer, the term of this patent is extended or adjusted under 35 U.S.C. 154(b) by 39 days.

(21) Appl. No.: 11/356,412

(22) Filed: Feb. 17, 2006

(51) Int. Cl.
*H03M 1/12* (2006.01)

(52) U.S. Cl. .................. 341/155; 341/136; 455/326; 455/333

(58) Field of Classification Search ............... None
See application file for complete search history.

(56) References Cited

U.S. PATENT DOCUMENTS

| | | | | |
|---|---|---|---|---|
| 5,471,210 A | * | 11/1995 | Wingender et al. ......... 341/156 |
| 5,528,175 A | * | 6/1996 | Sterzer ......................... 326/99 |
| 6,008,748 A | * | 12/1999 | Sterzer ......................... 341/155 |
| 6,230,001 B1 | * | 5/2001 | Wyse ........................... 455/326 |
| 6,411,801 B1 | * | 6/2002 | Kim et al. .................... 455/333 |
| 7,062,247 B2 | * | 6/2006 | Kovacevic et al. .......... 455/323 |

* cited by examiner

*Primary Examiner*—Khai M. Nguyen
(74) *Attorney, Agent, or Firm*—George Seligsohn

(57) ABSTRACT

$2^N-1$ four-terminal phase-reversing switches are arranged in one or more columns of cascaded switches, wherein a frequency having a given relative phase $\phi$ is applied as an input of the top switch in a cascade. A particular configuration of $2^N-1$ different reference-values, determined by a preselected N-Bit binary code, is applied to the respective $2^N-1$ switches so that (1) whenever the amplitude value of an applied analog signal reaches a value equal to the reference value applied to any switch, that switch will switch to reverse the phase at its output from the phase at its input, and (2) cause the switching of the phase at the output at each switch ordinally situated in a column below that switch. The respective output phases from a certain subset of N switches of the $2^N-1$ switches define the binary values of the preselected N-Bit binary code output from the A/D converter.

12 Claims, 12 Drawing Sheets

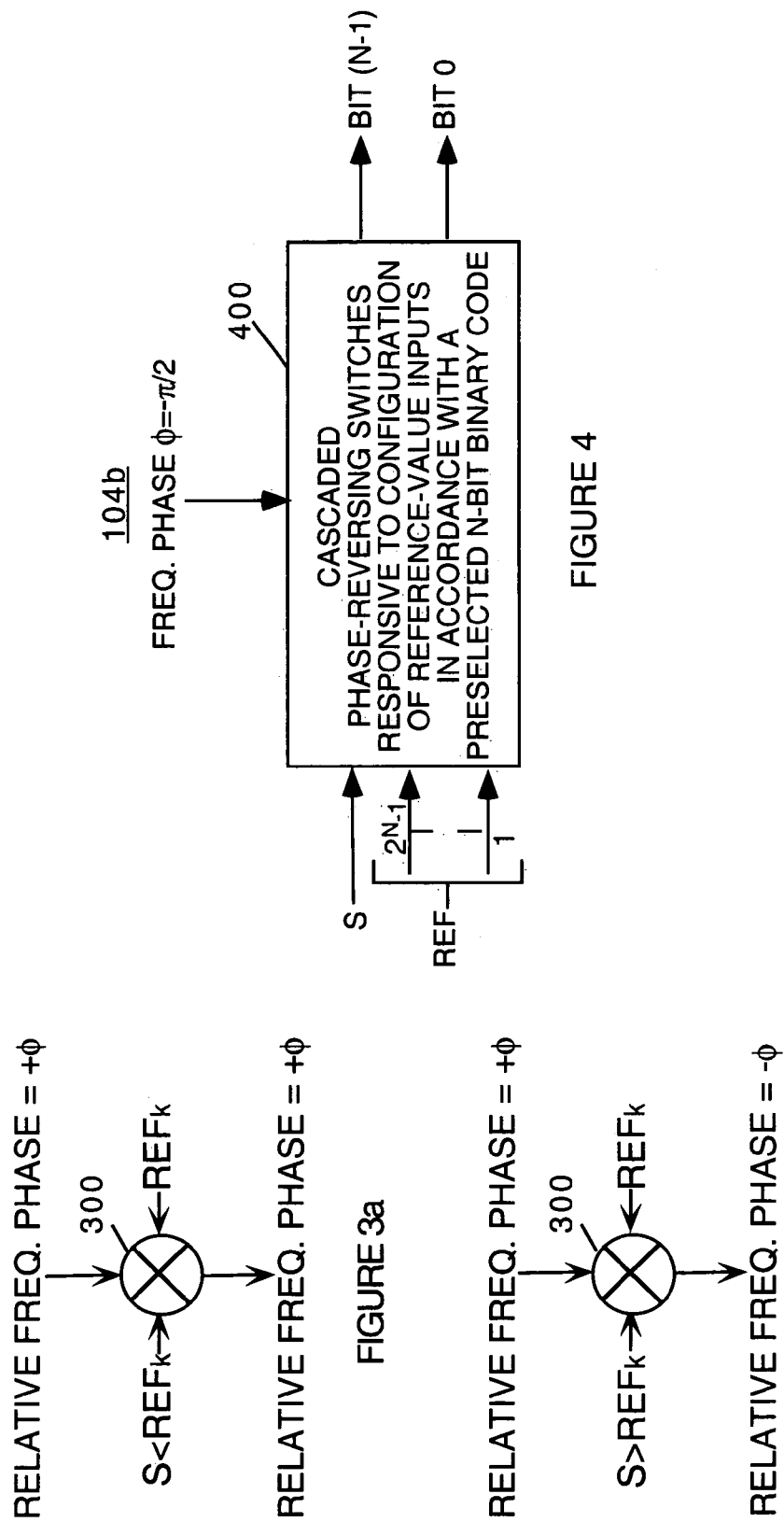

ANALOG-TO-DIGITAL CONVERTERS EMPLOYING CASCADED PHASE-REVERSING SWITCHES

This invention was made with Government support and the Government has certain rights to this invention.

BACKGROUND OF THE INVENTION

1. Field of the Invention

This invention relates to implementations of an analog-to-digital (A/D) converter that employ cascaded phase-reversing switches for converting the amplitude of an analog signal to a preselected N-Bit binary code and, more particularly, to such implementations that may use microwave-phase-logic (MPL) integrated-circuits suitable for operating on an analog signal having a multi-Gigahertz (GHz) bandwidth.

2. Description of the Prior Art

Incorporated by reference herein is U.S. Pat. No. 5,528,175, entitled "Devices for Implementing Microwave Phase Logic," which issued Jun. 18, 1996 and is assigned to the same assignee as the present invention. U.S. Pat. No. 5,528,175 discloses the MPL implementation of both a full-adder device and a memory element that can operate as a phase latch.

Further, incorporated by reference herein is U.S. Pat. No. 6,008,748, entitled "Microwave Phase Logic Implementation of an Analog-to-Digital Converter," which issued Dec. 28, 1999 and is assigned to the same assignee as the present invention. The implementation disclosed in U.S. Pat. No. 6,008,748 is directed to serial pipelined A/D converters that propagate both the analog signal and a reference, with the amplitude of the reference asymptotically approaching the amplitude of the analog signal but with a reversal of polarity or phase.

Known are flash A/D converters that employ an array of amplitude comparators for comparing, in ascending order, the amplitude of each of a plurality of reference-value inputs with the amplitude value of an analog signal input. If the amplitude of the signal input to any one of the comparators exceeds the amplitude of the reference-value input to that one comparator, the output from that comparator will be a binary "1" value. If the amplitude of the signal input to any one of the comparators does not exceed the amplitude of the reference-value input to that one comparator, the output from that comparator will be a binary "0" value. The output from the entire array of amplitude comparators is known as a "thermometer code." A flash A/D converter then needs a thermometer code to binary code converter (one of several known ways of implementing this comprises a complex array of many FULL ADDER logic devices) to decode the thermometer code and convert it to a selected N-Bit binary code output from the flash A/D converter.

Flash A/D converters also may be implemented employing an array of MPL phase-reversing switches as comparators, instead of employing amplitude comparators. In this case, the MPL FULL ADDER logic device disclosed in the aforesaid is U.S. Pat. No. 5,528,175 may be employed in the implementation of the complex array of many FULL ADDER logic devices to convert the thermometer code to a selected N-Bit binary code output from the flash A/D converter.

Known is a doubly-balanced mixer comprising a four-diode ring. Also known since 1967 is a doubly-balanced mixer called a Gilbert cell mixer that employs four transistors instead of four diodes. As known, a Gilbert cell mixer may form the basis of a common integrated-circuit bipolar building block. Because a Gilbert cell mixer exhibits gain (and a four-diode ring doubly-balanced mixer does not), a Gilbert cell mixer is the preferred implementation of each phase-reversing switch of a flash A/D converter and the cascaded phase-reversing switches employed in the MPL A/D converter implementation of the present invention. However, because conventional double-balanced mixers do not switch phase when two baseband inputs thereto are substantially equal, A/D converter implementation of the present invention with conventional double-balanced mixers needs phase latches.

SUMMARY OF THE INVENTION

An N-Bit A/D converter comprises $2^N-1$ phase-reversing switches, each of which includes 3 input terminals and 1 output terminal. The switches are arranged in one or more columns, wherein the output terminal of each switch in a column, except the bottom switch, is interconnected to the first input terminal of the immediately following switch in that column, thereby interconnecting the switches in a column in cascade. A carrier frequency having a given relative phase $\phi$ is applied to the first input terminal of the top phase-reversing switch in a column. An analog signal is applied to the second input terminal of all of the $2^N-1$ switches. A particular configuration of $2^N-1$ different reference-values REF 1 to REF $2^N-1$ is applied to the third input terminal of the respective $2^N-1$ switches that is determined by a preselected N-Bit binary code so that (1) whenever the amplitude value of the analog signal reaches a value equal to or above the reference value REF applied to any given switch, that given switch will switch to reverse the relative phase at its output terminal from the relative phase at its first input terminal, and (2) consequently cause the switching of the relative phase at the output terminal of each switch that is ordinally situated in a column of switches below that given switch. Thus, as determined by the preselected binary code, the respective phases at the output terminals of a certain subset of N switches of the $2^N-1$ switches define the binary values of the preselected N-Bit binary code output from the A/D converter

BRIEF DESCRIPTION OF THE DRAWING

FIG. 3a schematically shows the operation of a 4-terminal phase-reversing switch when the amplitude of an applied analog signal is below the amplitude of an applied reference value and FIG. 3b schematically shows the operation of a 4-terminal phase-reversing switch when the amplitude of an applied analog signal is equal to or above the amplitude of an applied reference value;

FIG. 4 is a block diagram generically showing that the A/D converter of the present invention comprises a configuration of reference-value inputs to cascaded phase-reversing switches in accordance with a preselected N-Bit binary code;

DESCRIPTION OF THE PREFERRED EMBODIMENTS

Both satellite communication and fiberoptics provide extremely broadband electromagnetic-wave transmission media capable of delivering multi-Gigahertz intelligence signals to a receiver. Currently, steps are being taken to extend fiberoptic transmission the so-called "last mile" directly to a consumer's home. At the same time, analog receivers for both radio and television signals are being replaced by broadband digital receivers. Such digital receivers are capable of receiving a large number of high-fidelity radio channels and a large number of high-definition television channels. Further, broadband digital receivers are used for other purposes, such as searching for extra-terrestrial intelligent life by inspecting received signals from space over bandwidths that extend from near-DC low frequencies to multi-Gigahertz high frequencies. With new technologies, such as monolithic high-performance SiGe bipolar technologies, integrated-circuit implementation of multi-Gigahertz-bandwidth digital receivers may be achieved.

Figure 1:
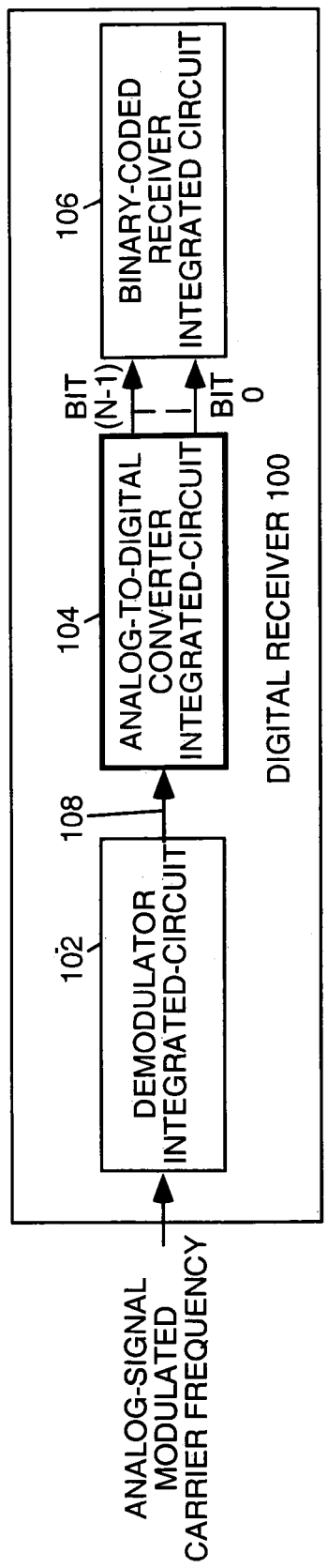
FIG. 1 is a generalized block diagram of the basic integrated-circuit components (which include an A/D converter) of a broadband digital receiver responsive to an analog-signal modulated carrier frequency input.

As shown FIG. 1, digital receiver 100 comprises demodulator integrated circuit 102, analog-to-digital (A/D) converter integrated circuit 104 and binary-coded receiver integrated circuit 106. A carrier frequency, which is amplitude or frequency modulated by an analog signal, is applied as an input to demodulator integrated circuit 102. The demodulated analog signal output 108 from demodulator integrated circuit 102 is applied as an input to A/D converter integrated circuit 104, which derives bits 0 to (N−1) of a selected N-Bit binary code as an output therefrom. This selected N-Bit binary code is then applied as an input to binary-coded receiver integrated circuit 106. The present invention is primarily directed to a novel implementation of A/D converter integrated circuit 104 that is an improvement over prior-art A/D converter integrated circuit 104a shown in FIG. 2.

Figure 2:
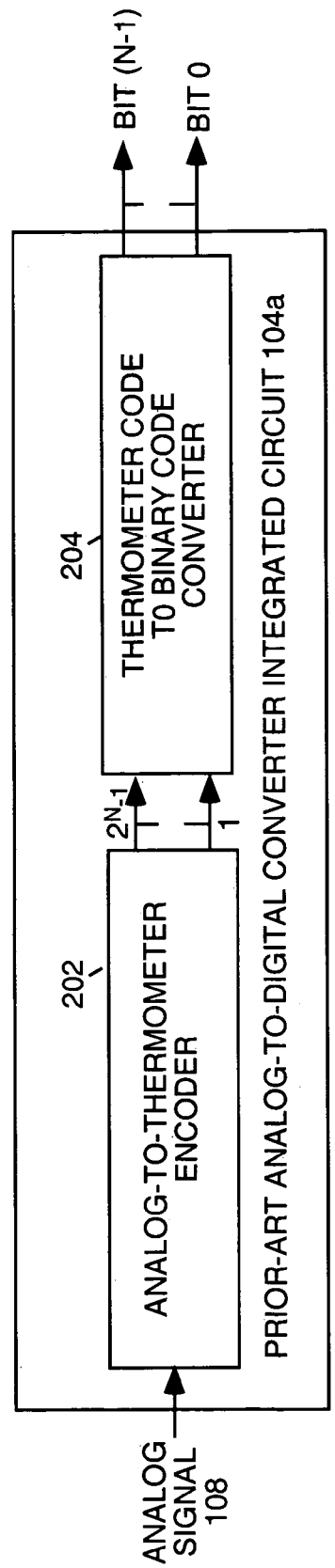
FIG. 2 is a block diagram of a prior-art A/D converter integrated circuit.
Figure 2A:
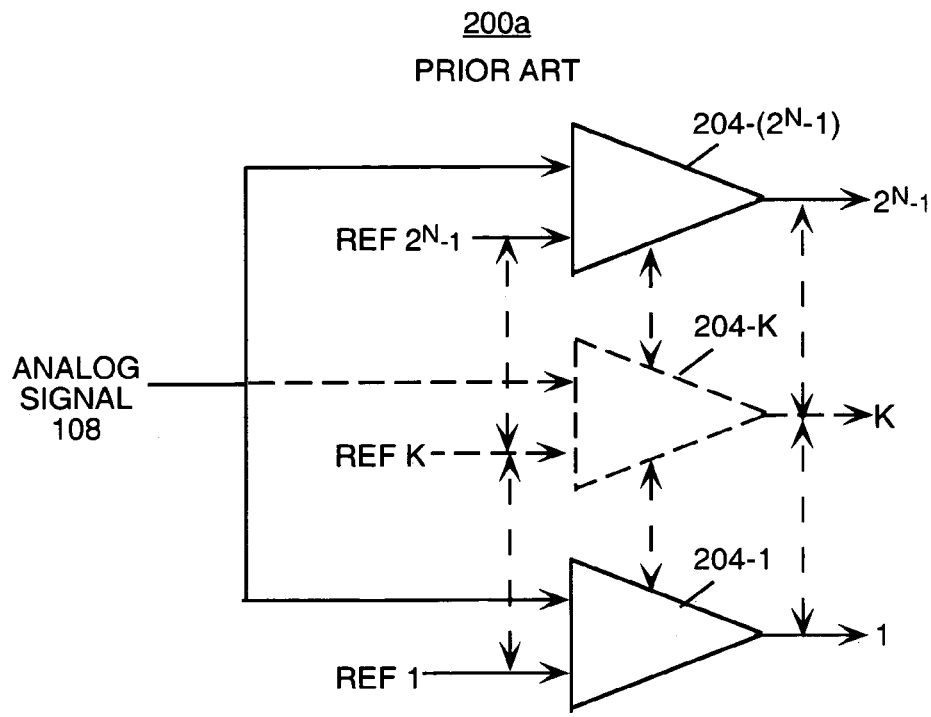
FIG. 2a is a block diagram of a prior-art amplitude implementation of the analog-to-thermometer encoder of FIG. 2
Figure 2B:
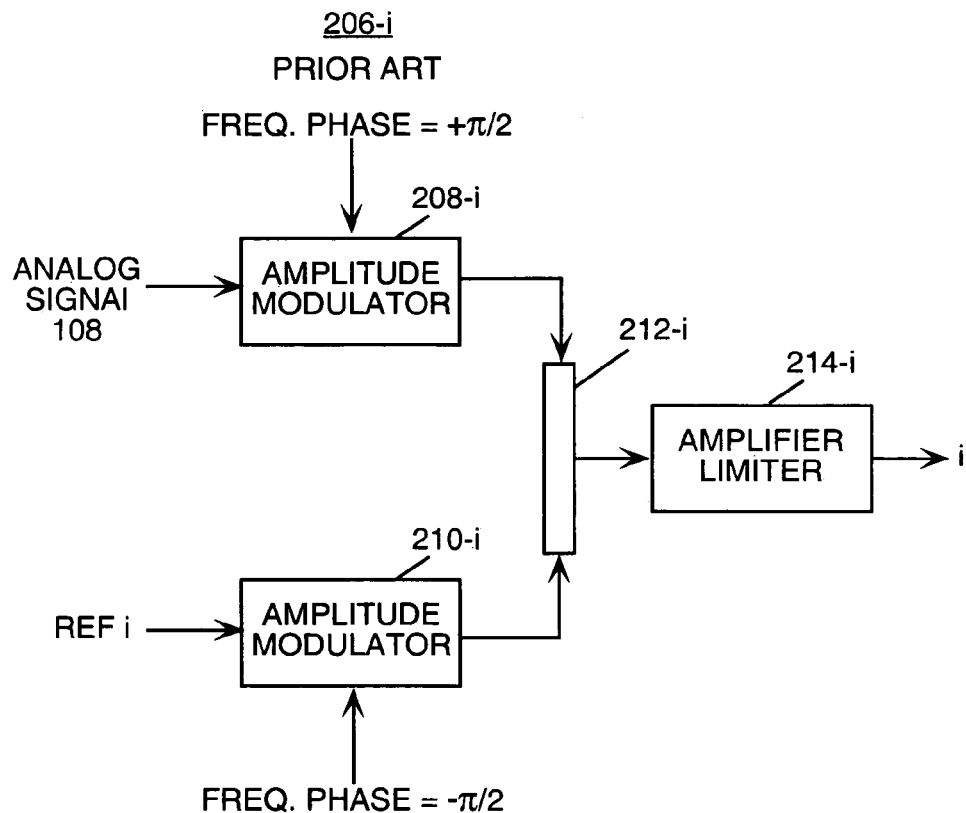
FIG. 2b is a block diagram of a prior-art phase implementation of the analog-to-thermometer encoder of FIG. 2.

As shown FIG. 2, prior-art A/D converter integrated circuit 104a (known as a flash A/D converter) comprises analog-to-thermometer encoder 200 and thermometer-code to binary code converter 202. Analog-to-thermometer encoder 200 (alternate implementations of which are shown in FIGS. 2a and 2b discussed below) operates to divide the dynamic range of the analog signal 108 input thereto into $2^N$ amplitude intervals defined, in ascending order, by $2^N-1$ reference values of a thermometer code. The $2^N-1$ reference-value thermometer-code outputs from encoder 200 are applied as an inputs to thermometer-code to binary code converter 202 (an implementation of which is shown in FIG. 2c discussed below), which decodes the thermometer code and converts it to a selected N-Bit binary code output comprising bits 0 to (N−1).

The implementation 200a of analog-to-thermometer encoder 200 shown in FIG. 2a, which employs amplitude-logic, comprises an array of $2^N-1$ comparators extending from comparator 204-1 to comparator 204-($2^N-1$) Analog signal 108 is applied as a first input to each of the comparators 204-1 to 204-($2^N-1$) of the array. A reference-value amplitude extending, in ascending order, from REF 1 to REF $2^N-1$ is applied as a second input to the corresponding one of comparators 204-1 to 204-($2^N-1$). If the dynamic amplitude range of analog signal 108a is limited to positive polarity, REF 1 has the smallest positive amplitude and REF $2^N-1$ has the largest positive amplitude. If the dynamic amplitude range of analog signal 108a is limited to negative polarity, REF 1 has the largest negative amplitude and REF $2^N-1$ has the smallest negative amplitude. If the dynamic amplitude range of analog signal 108a extends from negative polarity to positive polarity, REF 1 has the largest negative amplitude and REF $2^N-1$ has the largest positive amplitude. Should the polarity and amplitude value of analog signal 108 be below the polarity and amplitude of the reference value applied to any specified one of the $2^N-1$ comparators of the array, that specified one comparator will derive a binary "0" output. However, should the polarity and amplitude value of analog signal 108 be equal to or above the polarity and amplitude of the reference value applied to any specified one of the $2^N-1$ comparators of the array, that specified one comparator will derive a binary "1" output. Comparator 204-K is a particular comparator situated somewhere within the array between comparator 204-1 and comparator 204-($2^N-1$). For illustrative reasons, it is assumed that the polarity and amplitude of analog signal 108 happens to be just equal to the polarity and amplitude of REF K applied to comparator 204-K. In this case, (1) the output K from comparator 204-K is a binary "1"; (2) the output from each of those comparators of the array which, in ascending order, are below comparator 204-K will also be a binary "1", and (3) the output from each of those comparators of the array which, in ascending order, are above comparator 204-K will be a binary "0". Thus, the respective binary values of the outputs of all the comparators of the array constitute a "thermometer" code because it is analogous to the temperature reading of a mercury thermometer, where the height of the mercury column extends only up to the reading of the temperature being measured. The respective binary values of the outputs of all $2^N-1$ comparators of the array may be applied directly as an inputs to thermometer to binary-code converter 202 or, in the alternative, the respective binary values of the outputs of all $2^N-1$ comparators may be temporarily stored in a register (not shown), with the inputs to thermometer to binary-code converter 202 being read out from the register.

The implementation of analog-to-thermometer encoder 200 may employ microwave-phase-logic (MPL), rather than amplitude-logic. In this case, the MPL structure shown in FIG. 2b may be used to implement each one of the $2^N-1$ MPL comparators of an array corresponding to the above-described $2^N-1$ amplitude-comparator array shown in FIG. 2a. As shown in FIG. 2b, the structure of an MPL comparator 206-i (where i may have any value from 1 to $2^N-1$) comprises amplitude-modulator 208-i, amplitude-modulator 210-i, microwave coupler 212-i and amplifier limiter 214-i. Amplitude-modulator 208-i modulates its first input of a given frequency carrier having a relative phase of $+\pi/2$ with its second input of an analog signal. Amplitude-modulator 210-i modulates its first input of the given frequency carrier having a relative phase of $-\pi/2$ with its second input of reference value. RE.F i. The respective outputs of amplitude-modulators 208-i and 210-i are combined in microwave coupler 212-i derive an output therefrom that has an amplitude equal to the algebraic sum of the amplitude of the analog signal and the amplitude of REF i, with the phase of this output being the same as that of the larger one of these two amplitudes is applied as an input to amplifier limiter 214-i. Amplifier limiter 214-i, which has the output from microwave coupler 212-i applied as an input thereto, derives a carrier-frequency output i therefrom having a given fixed amplitude, which is independent of the output from microwave coupler 212-i, but having the same phase as the output from microwave coupler 212-i. Thus, if the amplitude of the analog signal is below the amplitude of REF i, the phase of carrier-frequency output i will be $-\pi/2$, indicative of a binary "0", but if the amplitude of the analog signal is equal to or above the amplitude of REF i, the phase of carrier-frequency output i will be $+\pi/2$, indicative of a binary "1".

Figure 2C:
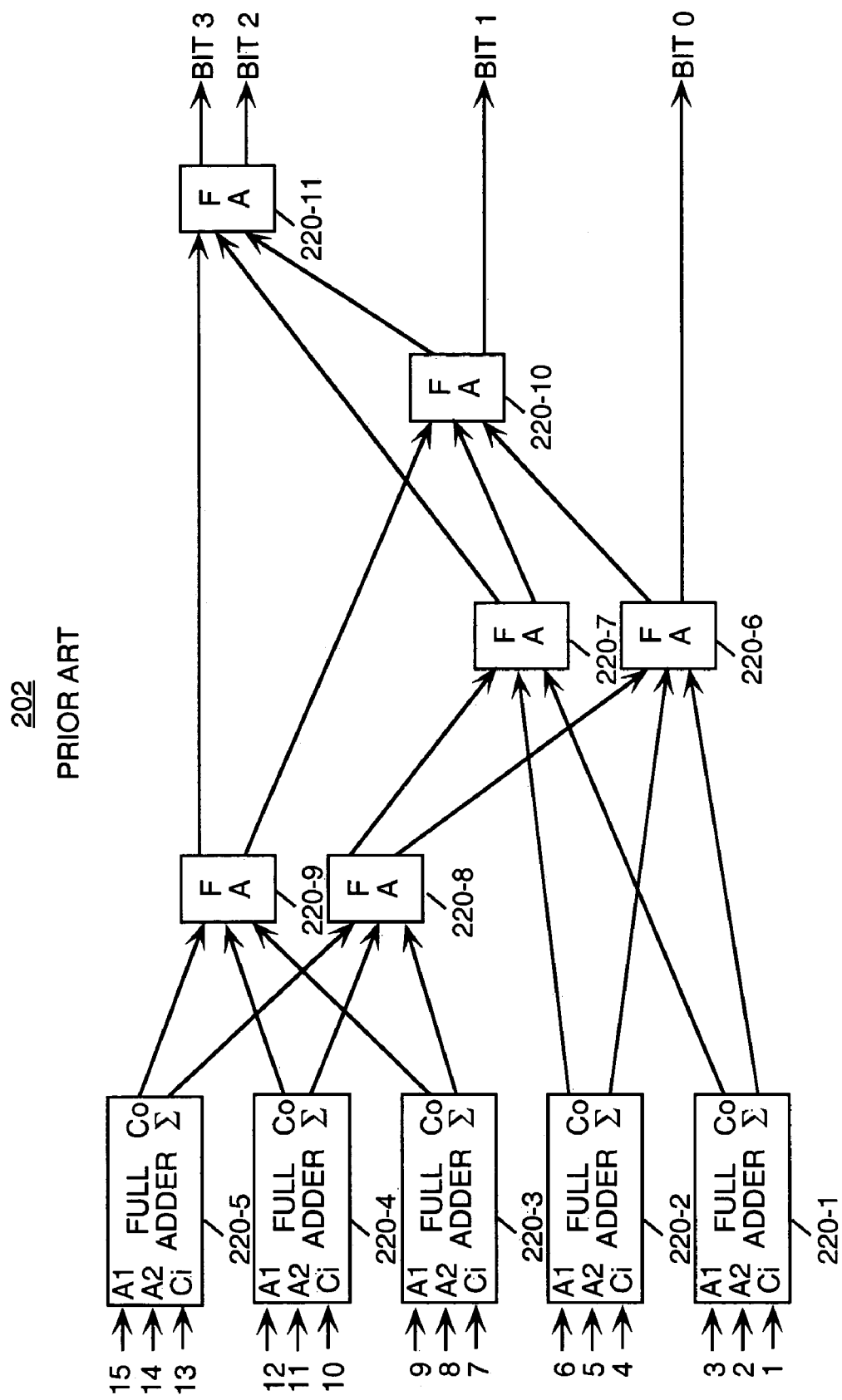
FIG. 2c is a block diagram of a prior-art amplitude implementation of the thermometer code to binary code converter of FIG. 2.

Referring now to FIG. 2c, there is shown an illustrative embodiment of thermometer-code to binary-code converter 202 for the case in which analog-to thermometer encoder 200 derives 15 outputs (i.e., the case in which N=4, resulting in the expression $2^N-=15$), which 15 outputs are then applied as 15 inputs to thermometer-code to binary-code converter 202. The thermometer-code to binary-code converter 202 shown in FIG. 2c is designed to convert the 15-input thermometer code into a 4-Bit standard binary code. As indicated in FIG. 2c, thermometer-code to binary-code converter 202 comprises an array of 11 full adders (F.A.), extending from full adder 220-1 to full adder 220-11. Each full adder includes first addend (A1), second addend (A2) and input-carry (Ci) inputs, together with output-carry (Co) and sum $\Sigma$ outputs, with the respective 15 inputs to thermometer-code to binary-code converter 202 being connected to the A1, A2 and Ci inputs of full adders 220-1 to 220-5. A complex interconnection configuration (1) interconnects the respective Co and $\Sigma$ outputs of full adders 220-1 to 220-5 to certain inputs of full adders 220-6 to 220-9, (2) interconnects the respective Co and $\Sigma$ outputs of full adders 220-6 to 220-9 to certain inputs of f . . . ull adders 220-6 to 220-11 and (3) interconnects the respective Co output of full adder 220-10 to the Ci input of full adder 220-11. The $\Sigma$ outputs of full adders 220-6, 220-10 and 220-11, together with the Co output of full adder 220-11 constitute the binary values of the converted 4-Bit standard binary code that results from the decoding of the 15-Bit thermometer code applied as an input to the illustrative embodiment of thermometer-code to binary-code converter 202 shown in FIG. 2c.

Full adders implemented with conventional amplitude logic may be employed when the analog-to-thermometer of FIG. 2a is used and full adders implemented with MPL taught in the aforesaid U.S. Pat. No. 5,528,175 logic may be employed when the analog-to-thermometer of FIG. 2b is used.

The number of full adders and their interconnections needed by a thermometer-code to binary-code converter goes up rapidly as the value of N goes up from the value of only 4 employed in the illustrative FIG. 2c embodiment. The need for any thermometer-code to binary-code converter at all is avoided by the binary N-Bit A/D converter of the present invention, which employs cascaded phase-reversing switches to inherently provide self-decoding of a thermometer code.

Figure 9:
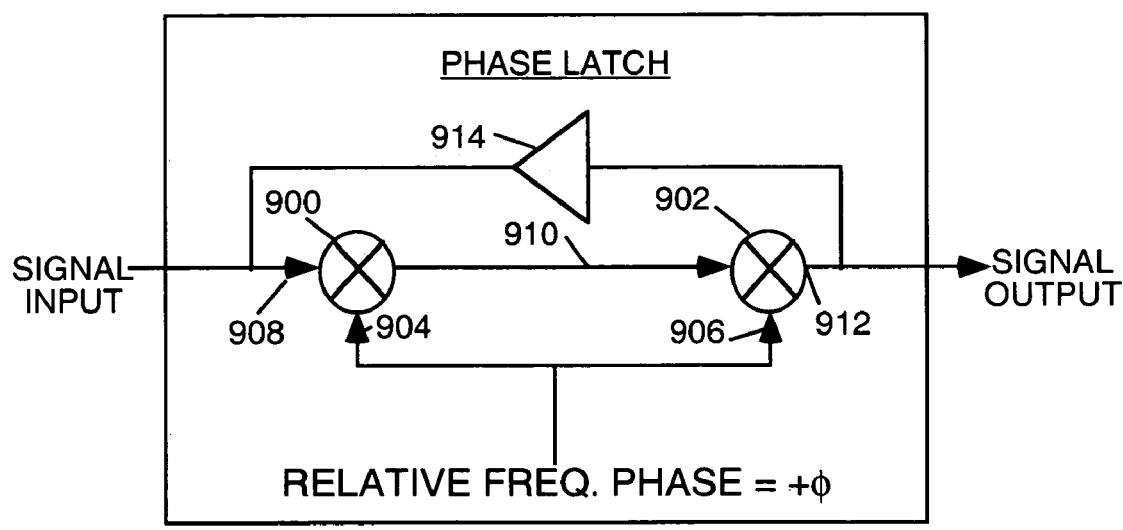
FIG. 9 shows a preferred implementation of a phase latch.

As shown in FIGS. 3a and 3b, phase-reversing switch 300 is a 4-terminal device (e.g., a doubly-balanced mixer) having three input terminals and one output terminal. A carrier having a relative frequency phase $+\phi$ is applied to the first input terminal; an analog signal S is applied to the second input terminal; a reference value REFk is applied to the third input terminal, and the output is derived from the fourth terminal. In accordance with the operation of phase-reversing switch 300 shown in FIG. 3a, if the polarity and amplitude of the analog signal S is below the polarity and amplitude of REFk, the output will be a carrier having a relative frequency phase $+\phi$ (the same phase as the carrier applied to the first input). However, in accordance with the operation of phase-reversing switch 300 shown in FIG. 3b, if the polarity and amplitude of the analog signal S is above the polarity and amplitude of REFk, the output will be a carrier having a relative frequency phase $-\phi$ (the opposite phase from the carrier applied to the first input). However, if the polarity and amplitude of the analog signal S is substantially equal to the polarity and amplitude of REFk, no output is derived for the case where a doubly-balanced mixer is used to implement phase-reversing switch 300. To avoid this problem of no output being derived, phase latches (which may be structurally implemented as shown in FIG. 9) are employed in all the implementations of the present invention, described below.

As generically shown in block 400 of FIG. 4, A/D converter integrated circuit 104b of the present invention includes cascaded phase-reversing switches that are responsive to (1) a carrier-frequency having a phase $\phi=-\pi/2$ applied thereto as a first input, (2) an analog signal S applied thereto as a second input and (3) $2^N-1$ reference REF values applied thereto as third inputs. As indicated in block 400, the cascaded phase-reversing switches are responsive to the configuration of the REF value inputs in accordance with a preselected N-Bit binary code to provide a Bit 0 to Bit (N−1)) output from block 400.

Figure 5:
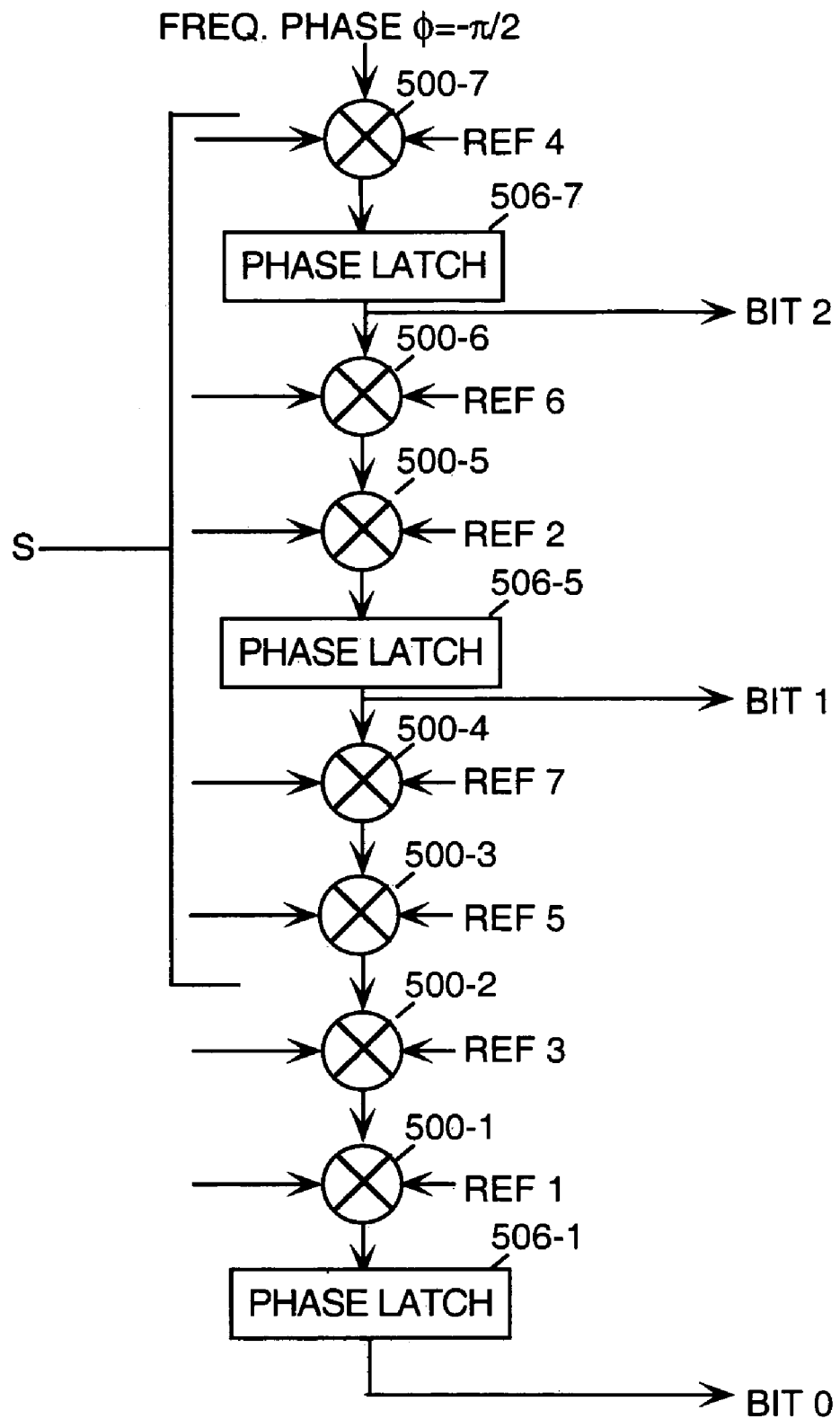
FIG. 5 is a first illustrative implementation of the A/D converter of FIG. 4 showing the configuration of reference-value inputs to the phase-reversing switches of a 3-Bit binary standard code.

FIG. 5 shows a first specific embodiment of A/D converter integrated circuit 104b of the present invention generically shown in block 400 of FIG. 4 for the case in which the preselected N-Bit binary code is a 3-Bit standard binary code. Shown in FIG. 5 are cascaded phase-reversing switches 500-1 to 500-7, together with phase latches 506-1, 506-5 and 506-7, arranged in a single column. A carrier-frequency having a phase $\phi=-\pi/2$ is applied as a first input to phase-reversing switch 500-7 and each of the respective outputs of phase-reversing switches 500-7 to 500-2 in the column is applied, in turn, (through phase latches 506-1, 506-5 and 506-7) to the first input of the next successive ordinal one of phase-reversing switches 500-6 to 500-1 in the column, thereby interconnecting phase-reversing switches 500-7 to 500-1 in cascade. Analog signal S is applied as a second input to all of phase-reversing switches 500-1 to 500-7. However, the reference-values REF 1 to REF 7 are applied as third inputs to phase-reversing switches 500-1 to 500-7 in accordance with the standard binary code. In particular, REF 4 is applied as a third input to phase-reversing switch 500-7; REF 6 is applied as a third input to phase-reversing switch 500-6; REF 2 is applied as a third input to phase-reversing switch 500-5; REF 7 is applied as a third input to phase-reversing switch 500-4; REF 5 is applied as a third input to phase-reversing switch 500-3; REF 3 is applied as a third input to phase-reversing switch 500-2, and REF 1 is applied as a third input to phase-reversing switch 500-1. Bit 0 is obtained at the output of phase latch 506-1; Bit 1 is obtained at the output of phase latch 506-5, and Bit 2 is obtained at the output of phase latch 506-7. The inclusion of these phase latches in the cascaded column ensures that the phase of each of Bit 0, Bit 1 and Bit 2 is always either $-\pi/2$ or $+\pi/2$, even for the case where no output is derived from phase-reversing switch 500-1, 500-5 or 500-7 because the polarity and amplitude of the analog signal S has become substantially equal to the polarity and amplitude of the REF applied thereto (as discussed above in connection with FIGS. 3*a* and 3*b*).

Figure 5A:
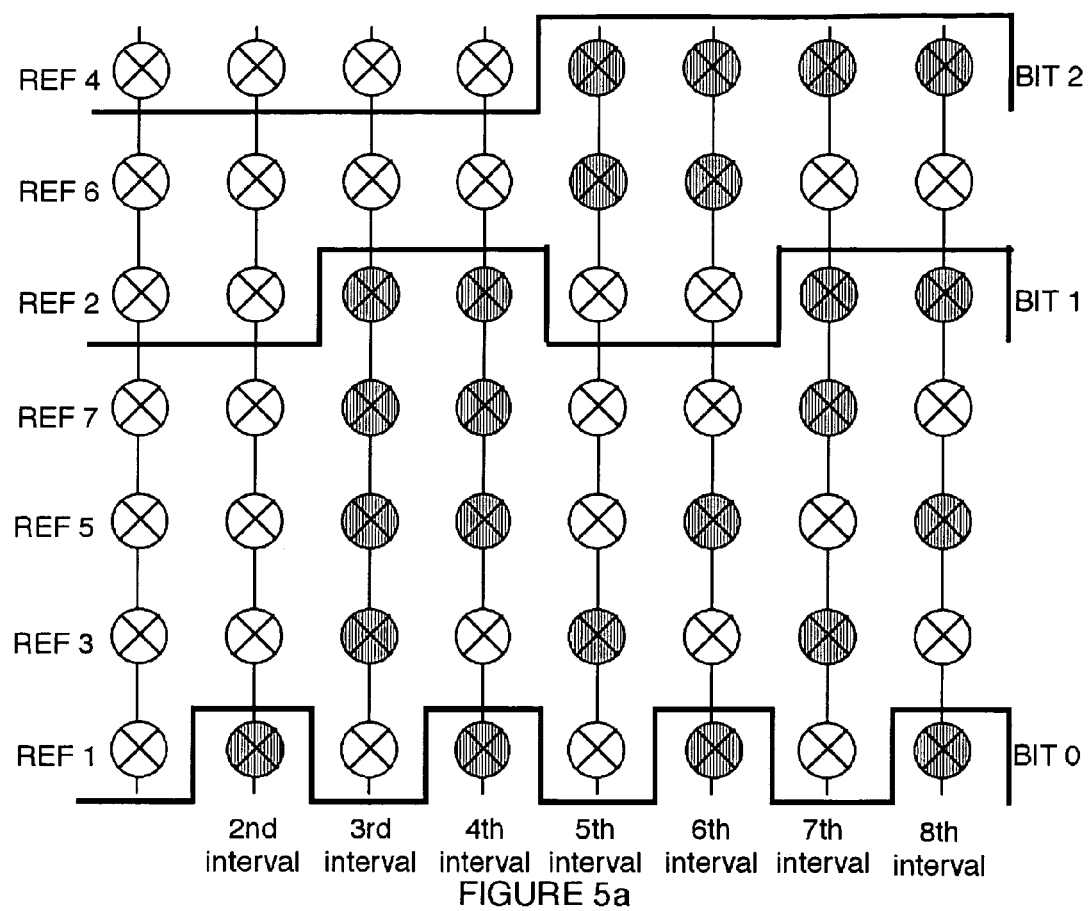
FIG. 5a schematically illustrates the operation of the first illustrative implementation of the A/D converter shown in FIG. 5.

FIG. 5*a* illustrates the operation of the first specific embodiment of A/D converter integrated circuit 104*b* shown in FIG. 5. The reference values REF 1 to REF 7 divide the dynamic range of the polarity and amplitude of analog signal S into 8 intervals. The polarity and amplitude of analog signal S is in a range extending from below to equal the polarity and amplitude of REF 1 in the 1st interval. The polarity and amplitude of analog signal S is in a range extending from equal to REF. 1 to below or equal to REF 2 in the 2nd interval. The polarity and amplitude of analog signal S is in a range extending from equal to REF 2 to below or equal to REF 3 in the 3rd interval. The polarity and amplitude of analog signal S is in a range extending from equal to REF 3 to below or equal to REF 4 in the 4th interval. The polarity and amplitude of analog signal S is in a range extending from equal to REF 4 to below or equal to REF 5 in the 5th interval. The polarity and amplitude of analog signal S is in a range extending from equal to REF 5 to below or equal to REF 6 in the 6th interval. The polarity and amplitude of analog signal S is in a range extending from equal to REF 6 to below or equal to REF 7 in the 7th interval. The polarity and amplitude of analog signal S is in a range extending from equal to or above REF 7 in the 8th interval. Those phase-reversing switches of FIG. 5*a* shown with hatching have output phase states of $+\pi/2$, while those phase-reversing switches of FIG. 5*a* shown without hatching have output phase states of $-\pi/2$. Whenever the output of any given phase-reversing switch is switched from one state to its opposite state, the outputs of each phase-reversing switch situated below that given phase-reversing switch in the cascade will also be switched to its opposite state (for reasons discussed above in connection with FIGS. 3*a* and 3*b*). This results in each of the 7 phase-reversing switches having the output-phase state in each of the 8 dynamic-range intervals shown in FIG. 5*a* to provide thereby binary values for Bit 0, Bit 1 and Bit 2 at the outputs of phase-reversing switches 500-7, 500-3 and 500-1 (shown in FIG. 5) that are in accordance with the standard binary code.

The first specific embodiment of A/D converter integrated circuit 104*b* shown in FIG. 5 has two undesirable features. First, a change in binary value in the standard binary code may involve a change in the binary values of a plurality of bits at the same tine (e.g., a change from 1 to 2 involves both a change of Bit 1 from binary "0" to binary "1" and a change of Bit 0 from binary "1" to binary "0"). Second, because the switching operation of a phase-reversing switch involves a certain switch delay, switching of a plurality of phase-reversing switches in cascade involves a plurality of such switch delays. Thus, in FIG. 5, there are 4 switch delays between the output from the Bit-1 switch 500-5 and the output from the Bit-0 switch 500-1 and there are 6 switch delays between the output from the Bit-2 switch 500-7 and the output from the Bit-0 switch 500-1.

Figure 6:
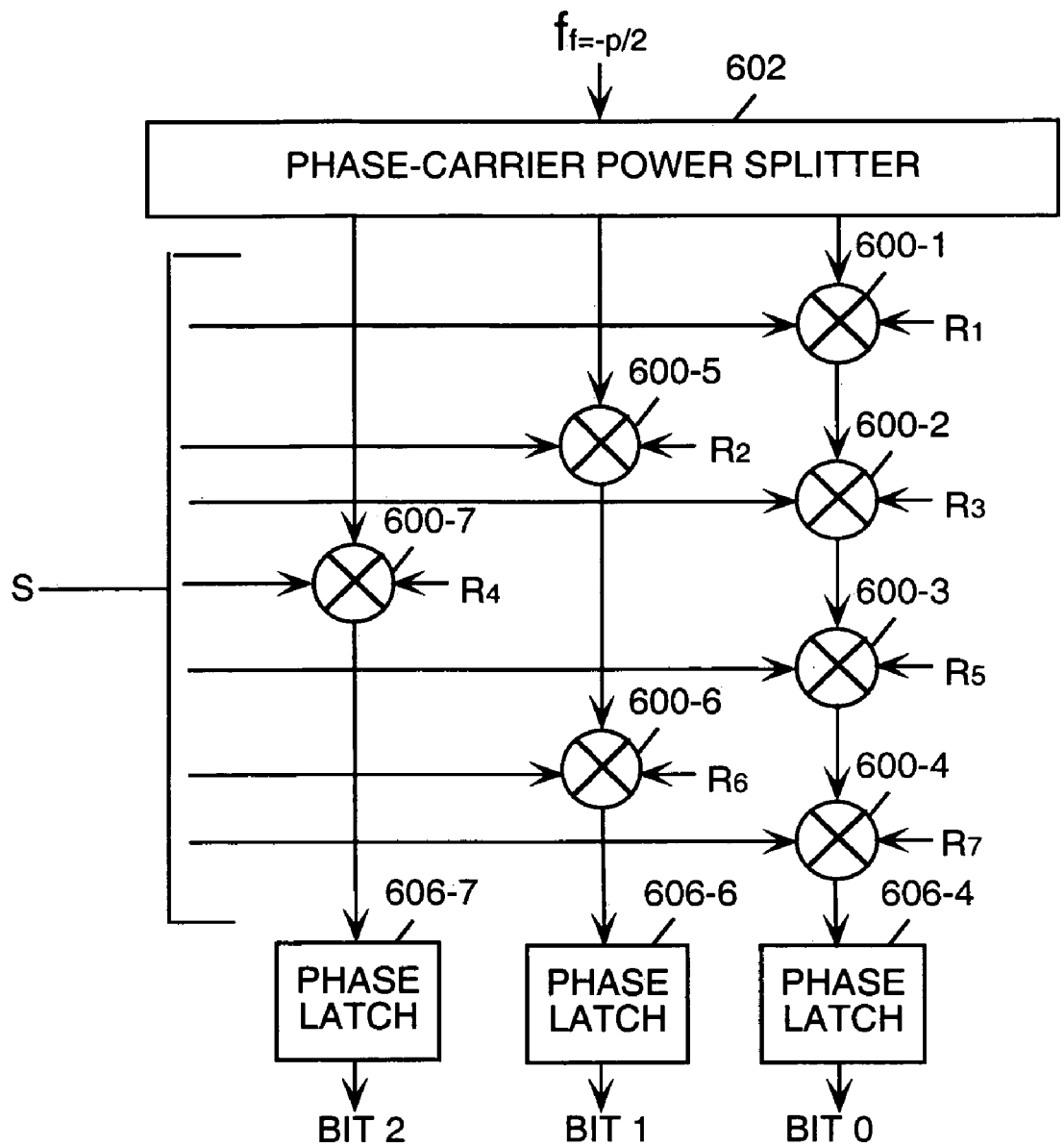
FIG. 6 is a second illustrative implementation of the A/D converter of FIG. 4 showing the configuration of reference-value inputs to the phase-reversing switches of a 3-Bit binary Gray code.

FIG. 6 shows a second specific embodiment of A/D converter integrated circuit 104*b* of the present invention generically shown in block 400 of FIG. 4 for the case in which the preselected N-Bit binary code is a 3-Bit Gray binary code. Shown in FIG. 6 are phase-reversing switches 600-1 to 600-7 arranged in 3 columns. The 1st column comprises phase-reversing switches 600-1 to 600-4 interconnected in cascade; the 2nd column comprises phase-reversing switches 600-5 and 600-6 interconnected in cascade, and the 3rd column comprises solely phase-reversing switch 600-7. A carrier-frequency having a phase $\phi=-\pi/2$ is applied as an input to phase-carrier power splitter 602. A first output from phase-carrier power splitter 602 is applied as a first input to phase-reversing switch 600-1 of the 1st column; a second output from phase-carrier power splitter 602 is applied as a first input to phase-reversing switch 600-5 of the 2nd column and a third output from phase-carrier power splitter 602 is applied as a first input to phase-reversing switch 600-7 of the 3rd column. Analog signal S is applied as a second input to all of phase-reversing switches 600-1 to 600-7. However, the reference-values REF 1 to REF 7 are applied as third inputs to phase-reversing switches 600-1 to 600-7 in accordance with the Gray binary code. In particular, REF 1 is applied as a third input to phase-reversing switch 600-1; REF 3 is applied as a third input to phase-reversing switch 600-2; REF 5 is applied as a third input to phase-reversing switch 600-3; REF 7 is applied as a third input to phase-reversing switch 600-4; REF 2 is applied as a third input to phase-reversing switch 600-5; REF 6 is applied as a third input to phase-reversing switch 600-6, and REF 4 is applied as a third input to phase-reversing switch 600-7. The output of phase-reversing switch 600-4 is applied as an input to phase latch 606-4 and Bit 0 is obtained at the output of phase latch 606-4. The output of phase-reversing switch 600-6 is applied as an input to phase latch 606-6 and Bit 1 is obtained at the output of phase latch 606-6. The output of phase-reversing switch 600-7 is applied as an input to phase latch 606-7 and Bit 2 is obtained at the output of phase latch 606-7. The function of the phase latches in FIG. 6 is the same as the function described above in connection with the phase latches in FIG. 5.

The second specific embodiment of A/D converter integrated circuit 104*b* shown in FIG. 6 eliminates the first undesirable feature and reduces somewhat the second undesirable feature of the standard binary code discussed above in connection with FIG. 5. First, a change in binary value in a Gray binary code involves a change in the binary value of only a single Bit at a tine. Second, in FIG. 6 there are only 3 switch delays between the output from the Bit-2 switch 600-7 and the Bit-0 switch 600-4.

Figure 7:
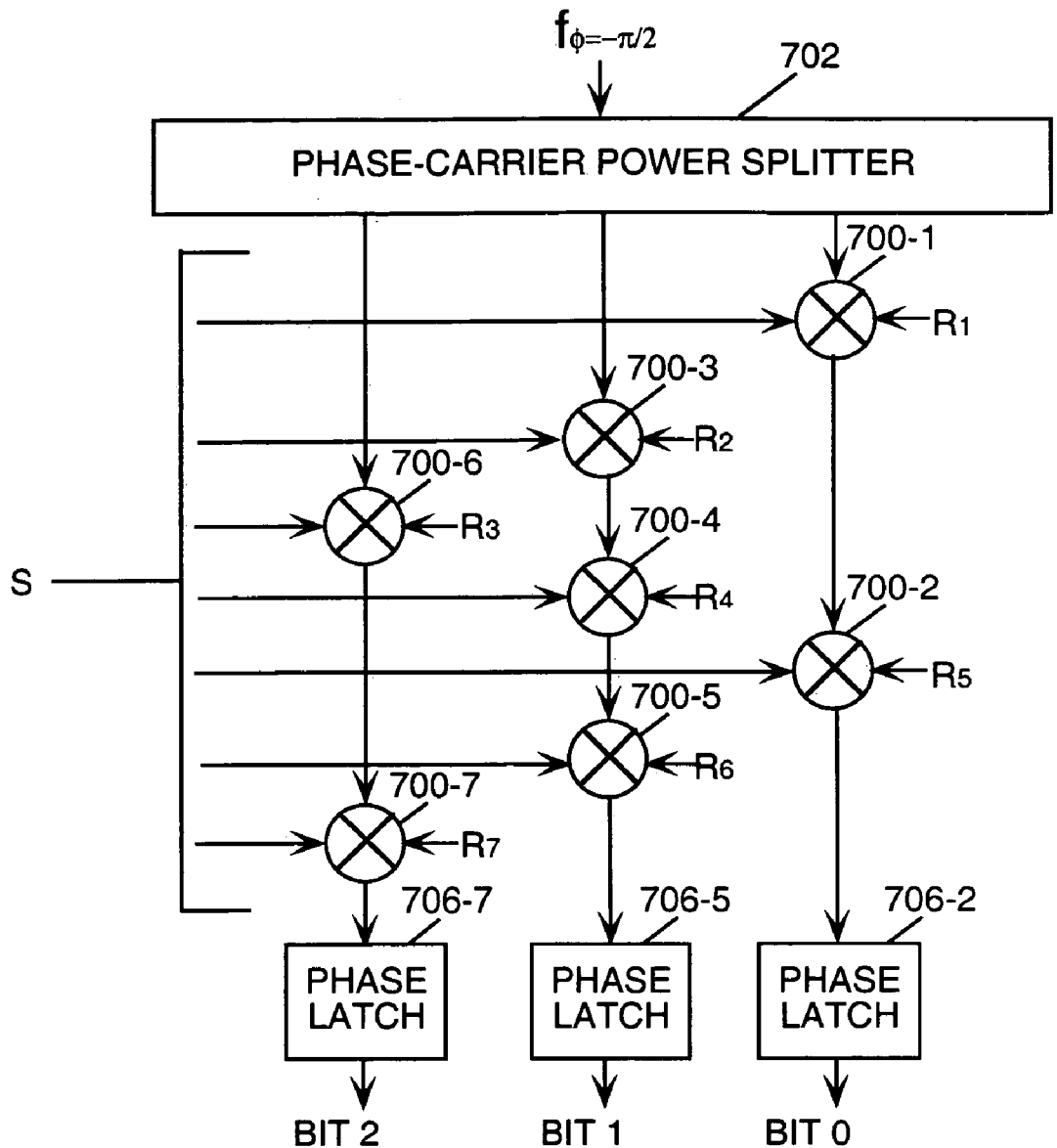
FIG. 7 is a third illustrative implementation of the A/D converter of FIG. 4 showing the configuration of reference-value inputs to the phase-reversing switches of a variant of a 3-Bit binary Gray code.

FIG. 7 shows a third specific embodiment of A/D converter integrated circuit 104*b* of the present invention generically shown in block 400 of FIG. 4 for the case in which the preselected N-Bit binary code is a 3-Bit non-conventional variant of the Gray binary code shown in FIG. 6. Shown in FIG. 7 are phase-reversing switches 700-1 to 700-7 arranged in 3 columns. The 1st column comprises phase-reversing switches 700-1 and 700-2 interconnected in cascade; the 2nd column comprises phase-reversing switches 700-3 to 700-5 interconnected in cascade, and the 3rd column comprises phase-reversing switches 700-6 and 700-7 interconnected in cascade. A carrier-frequency having a phase $\phi=-\pi/2$ is applied as an input to phase-carrier power splitter 702. A first output from phase-carrier power splitter 702 is applied as a first input to phase-reversing switch 700-1 of the 1st column; a second output from phase-carrier power splitter 702 is applied as a first input to phase-reversing switch 700-3 of the 2nd column, and a third output from phase-carrier power splitter 702 is applied as a first input to phase-reversing switch 700-6 of the 3rd column. Analog signal S is applied as a second input to all of phase-reversing switches 700-1; to 700-7. However, the reference-values REF 1 to REF 7 are applied as third inputs to phase-reversing switches 700-1 to 700-7 in accordance with the variant of the Gray binary code. In particular, REF 1 is applied as a third input to phase-reversing switch 700-1; REF 5 is applied as a third input to phase-reversing switch 700-2; REF 2 is applied as a third input to phase-reversing switch 700-3; REF 4 is applied as a third input to phase-reversing switch 700-4; REF 6 is applied as a third input to phase-reversing switch 700-5; REF 3 is applied as a third input to phase-reversing switch 700-6, and REF 7 is applied as a third input to phase-reversing switch 700-7. The output of phase-reversing switch 700-2 is applied as an input to phase latch 706-2 and Bit 0 is obtained at the output of phase latch 706-2. The output of phase-reversing switch 700-5 is applied as an input to phase latch 706-5 and Bit 1 is obtained at the output of phase latch 706-5. The output of phase-reversing switch 700-7 is applied as an input to phase latch 706-7 and Bit 2 is obtained at the output of phase latch 706-7. The function of the phase latches in FIG. 7 is the same as the function described above in connection with the phase latches in FIG. 5.

The third specific embodiment of A/D converter integrated circuit 104b shown in FIG. 7 also eliminates the first undesirable feature and reduces the second undesirable feature of the standard binary code discussed above in connection with FIG. 5 to only a single switch delay. First, a change in binary value in a Gray binary code involves a change in the binary value of only a single Bit at a time. Second, in FIG. 7 there is only one extra switch delay between the output from the Bit 1 switch 700-3 and the output from either the Bit-2 switch 700-6 or the Bit-0 switch 700-1.

Figure 7A:
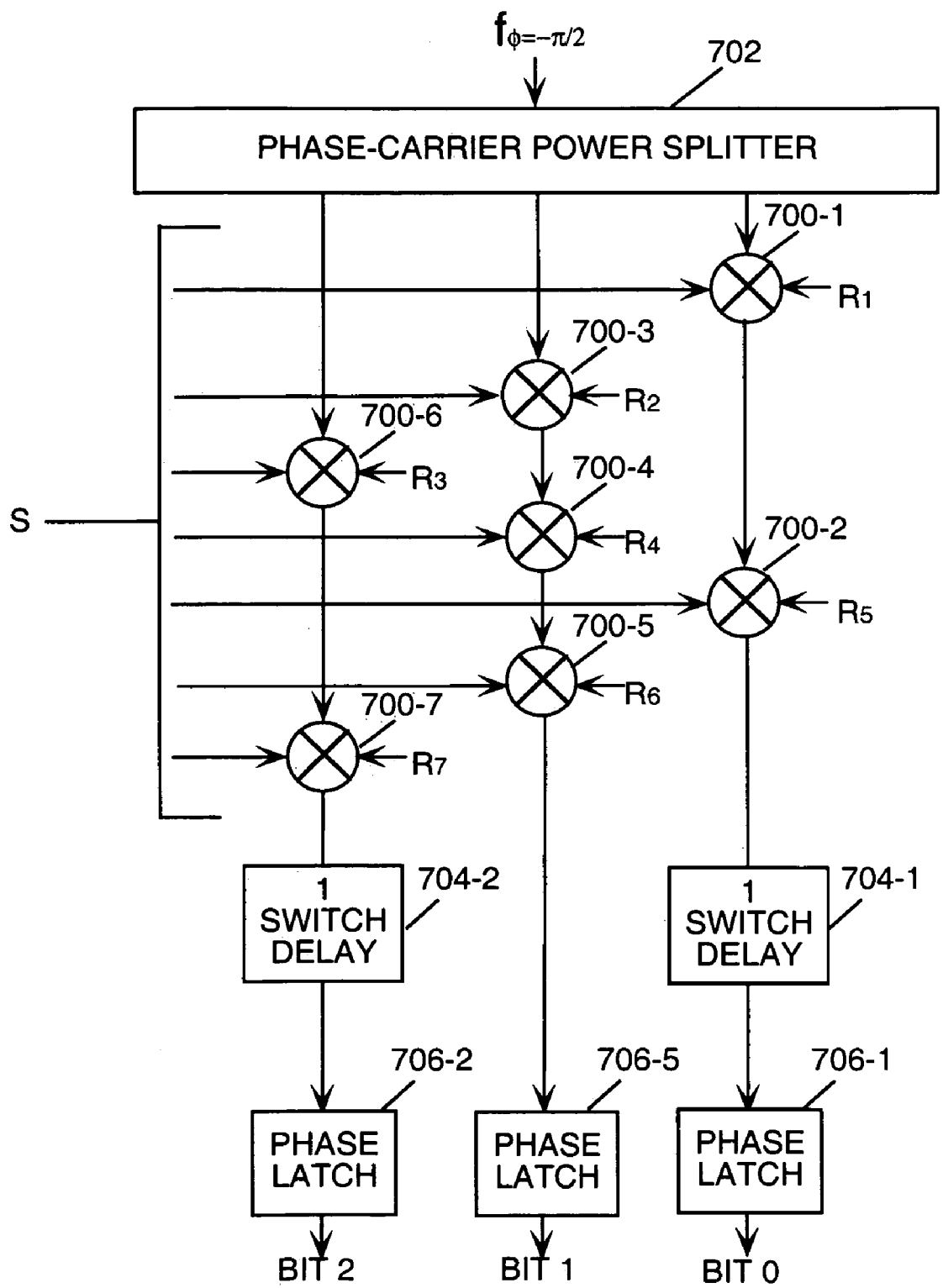
FIG. 7a shows a modification of the third illustrative implementation of the A/D converter shown in FIG. 7, which modification introduces additional switch-delays therein.

As shown in FIG. 7a, the use of means 704-1 for delaying the output from phase-reversing switch 702-2 by an additional 1 switch delay and means 704-2 for delaying the output from phase-reversing switch 700-7 by an additional 1 switch delay makes it possible to achieve a 0 switch delay among Bit 2, Bit 1 and Bit 0. One way of implementing means 704-1 or means 704-2 is to provide an additional phase-reversing switch to the cascade that has a REF value applied to its third input which is higher than the highest amplitude in the dynamic range of the analog signal applied to its second input, so that this additional phase-reversing switch never switches its phase state. Another way of implementing means 704-1 or means 704-2 is to employ a delay line that inserts a measured delay just equal to 1 switch delay. The use of similar type means could be used to insert the proper measured delays to achieve a 0 switch delay among Bit 2, Bit 1 and Bit 0 of the standard binary code of FIG. 5 and the Gray binary code of FIG. 6. Further, in FIG. 7a, the output of 1 switch delay 704-1 is applied as an input to phase latch 706-1 and Bit 0 is obtained at the output of phase latch 706-1. The output of phase-reversing switch 700-5 is applied as an input to phase latch 706-5 and Bit 1 is obtained at the output of phase latch 706-5. The output of 1 switch delay 704-2 is applied as an input to phase latch 706-2 and Bit 2 is obtained at the output of phase latch 706-2. The function of the phase latches in FIG. 7a is the same as the function described above in connection with the phase latches in FIG. 5.

The basic concept of the present invention, utilized by all 3 of the 3-Bit illustrative specific embodiments of FIGS. 5, 6 and 7, is that the switching of a higher-numbered cascaded phase-reversing switch in any column results in the switching of all the lower-numbered cascaded phase-reversing switches in that column. It is for this reason that the order of the reference values for the single column of cascaded phase-reversing switches 1 to 7 of the 3-Bit standard binary code of FIG. 5 is the 1st-order odd reference values 1–3–5–7 for Bit 0, followed by the 2nd-order odd reference values 2–6 for Bit 1, and followed by the 3rd-order odd reference value 4 for Bit 2. Similarly, in the case of a single column of cascaded phase-reversing switches 1 to 15 of a 4-Bit standard binary code, the order of the reference values would be 1–3–5–7–9–11–13–15 for Bit 0, followed by 2–6–10–14 for Bit 1, followed by 4–12 for Bit 2, and followed by 8 for Bit 3. In the case of a single column of cascaded phase-reversing switches 1 to 31 of a 5-Bit standard binary code, the order of the reference values would be 1–3–5–7–9–11–13–15–17–19–21–23–25–27–29–31 for Bit 0, followed by 2–6–10–14–18–22–26–30 for Bit 1, followed by 4–12–20–28 for Bit 2, followed by 8–24 for Bit 3. and followed by 16 for Bit 4. This type of relationship may be extended to the case among the order of $2^N-1$ reference values applied to the single column of $2^N-1$ cascaded phase-reversing switches of an N-Bit standard binary code.

Generalizing, the A/D converter integrated circuit 104b of the present invention generically shown in block 400 of FIG. 4 derives a preselected conventional (e.g., standard binary, Gray, 2's complement, etc.) or non-conventional (e.g., the variant Gray Code of FIG. 7) N-bit binary code in accordance with $2^N-1$ different reference values that divide the dynamic amplitude range of an analog signal into $2^N$ amplitude intervals. This is accomplished by employing $2^N-1$ phase-reversing switches (each having 4 terminals as shown in FIGS. 5, 6 and 7) arranged between 1 and N columns, with at least one of the columns comprising phase-reversing switches that are interconnected in cascade. Each of the different $2^N-1$ reference values is applied to a different one of the $2^N-1$ phase-reversing switches in accordance with the preselected N-bit binary code in such a manner that the switching of a given phase-reversing switch situated higher in the cascade of any column of cascaded phase-reversing switches will cause the switching of all those phase-reversing switches situated lower in the cascade of that column than the given phase-reversing switch. In the case of a non-conventional binary code, a look-up table (not shown) may be required to convert it to some particular conventional binary code that is desired.

In principle, at a low-enough frequency, a 4-terminal phase-reversing switch could be implemented by a single-pole, double-throw (SPDT) electromagnetic reversing-switch energized by the algebraic difference between the amplitudes of an analog signal and a reference value, so that the reversing switch remains in a first state so long as the polarity and amplitude of the analog signal is below that of the reference value and switches to a second state should the polarity and amplitude of the analog signal be equal to or above that of the reference value. With a SPDT electromagnetic reversing-switch implementation, no phase latches are required. However, at a microwave or high RF frequency (with which the present invention is more concerned), each 4-terminal phase-reversing switch is preferably in the form of a doubly-balanced mixer implemented with MPL which do require phase latches. Although a diode-ring mixer, employing 4 diodes, can be used to implement a doubly-balanced mixer, a Gilbert cell mixer, which exhibits gain, is to be preferred for this use.

Figure 8A:
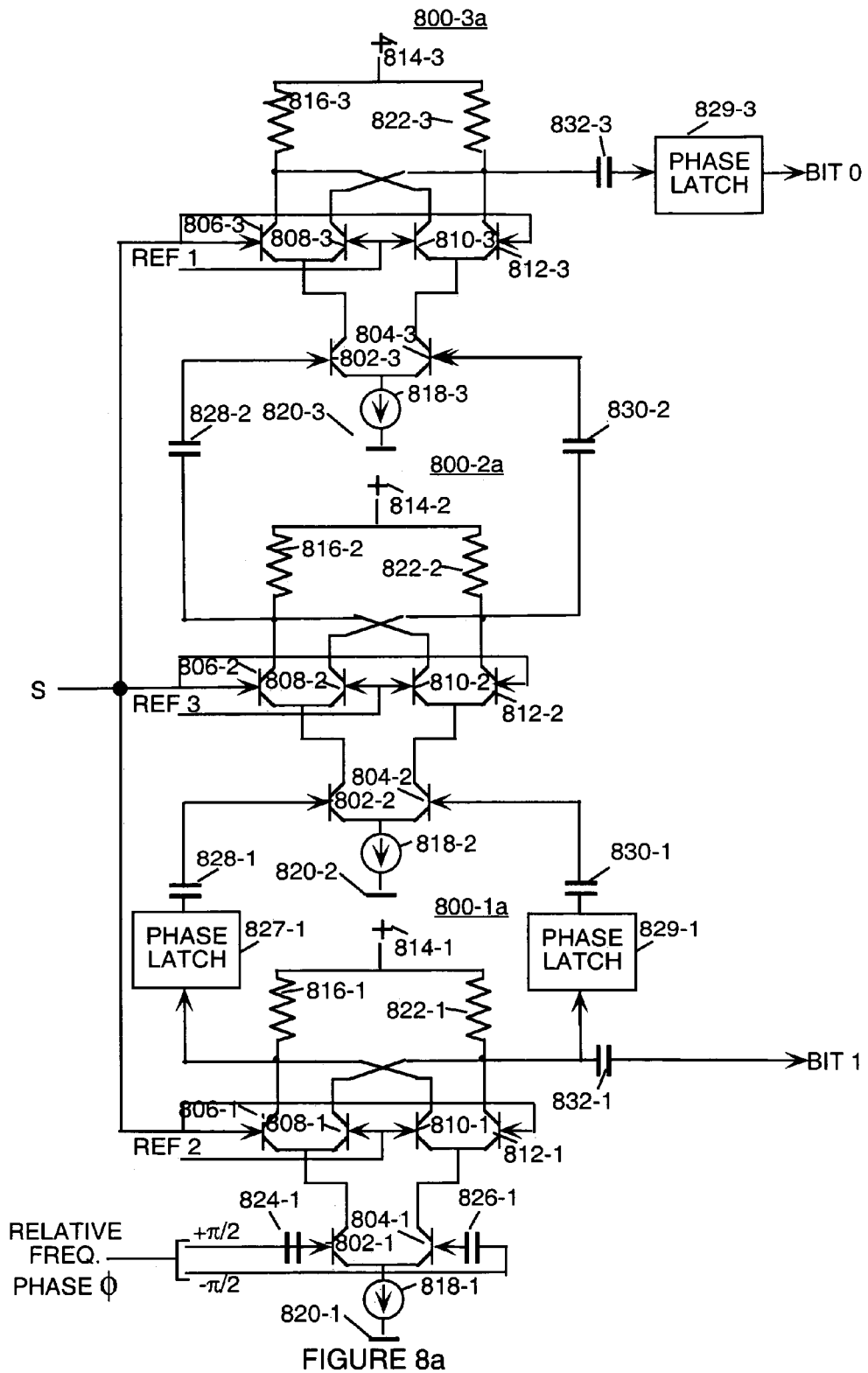
FIG. 8a shows a preferred implementation of cascaded phase-reversing switches comprising cascaded Gilbert cell mixers and FIG. 8b shows an alternative implementation of cascaded phase-reversing switches comprising cascaded Gilbert cell mixers.

Referring to FIG. 8a, there is shown a schematic diagram of an AC-coupled circuit of cascaded Gilbert-cell mixers, which comprises a preferred implementation of a cascaded column of phase-reversing switches (such as utilized in each of FIGS. 5, 6 and 7). As a particular example, FIG. 8a, shows the AC-coupled circuits for each of cascaded Gilbert-cell mixers 800-1a, 800-2a and 800-3a that together provide the Bit-0 and Bit-1 outputs of a 2-Bit standard binary code.

Gilbert-cell mixer 800-1a comprises transistors 802-1, 804-1, 806-1, 808-1, 810-1 and 812-1. A first path through which current can flow is from positive-voltage (+) terminal 814-1 and through resistance 816-1, the collector-to-emitter of transistors 806-1 and 810-1, the collector-to-emitter of transistors 802-1 and 804-1, and then through constant-current source 818-1 to negative (−) terminal 820-1. A second path through which current can flow is from positive (+) terminal 814-1 and through resistance 822-1, the collector-to-emitter of 808-1 and 812-1, the collector-to-emitter of transistors 802-1 and 804-1, and then through constant-current source 818-1 to negative-voltage (−) terminal 820-1. Gilbert-cell mixer 800-2a comprises elements 802-2, 804-2, 806-2, 808-2, 810-2, 812-2, 814-2, 816-2, 818-2, 820-2 and 822-2 that correspond, respectively, to elements 802-1, 804-1, 806-1, 808-1, 810-1, 812-1, 814-1, 816-1, 818-1, 820-1 and 822-1 of above-described Gilbert-cell mixer 800-1a of above-described Gilbert-cell mixer 800-1a. Similarly, Gilbert-cell mixer 800-3a comprises elements 802-3, 804-3, 806-3, 808-3, 810-3, 812-3, 814-3, 816-3, 818-3, 820-3 and 822-3 that correspond, respectively, to elements 802-1, 804-1, 806-1, 808-1, 810-1, 812-1, 814-1, 816-1, 818-1, 820-1 and 822-1 of above-described Gilbert-cell mixer 800-1a.

In the case of Gilbert-cell mixer 800-1a, a carrier frequency with a phase φ=+π/2 is applied through capacitance 824-1 to the base of transistor 802-1 and this carrier frequency with a phase φ=−π/2 is applied through capacitance 826-1 to the base of transistor 804-1. Also, the reference value REF 2 is applied to the interconnected bases of transistors 808-1 and 810-1.

In the case of Gilbert-cell mixer 800-2a (which has its input cascaded to the output from Gilbert-cell mixer 800-1a), a first output from Gilbert-cell mixer 800-1a (appearing at the junction of resistance 816-1 and the collectors of transistors 806-1 and 810-1) is applied through phase latch 827-1 and capacitance 828-1 as an input to the base of transistor 802-2 of cascaded Gilbert-cell mixer 800-2a. A second output from Gilbert-cell mixer 800-1a (appearing at the junction of resistance 822-1 and the collectors of transistors 808-1 and 812-1) is applied through phase latch 829-1 and capacitance 830-1 as an input to the base of transistor 804-2 of cascaded Gilbert-cell mixer 800-2a. Also, the reference value REF 3 is applied to the interconnected bases of transistors 808-2 and 810-2.

In the case of Gilbert-cell mixer 800-3a (which has its input cascaded to the output from Gilbert-cell mixer 800-2a), a first output from Gilbert-cell mixer 800-1a (appearing at the junction of resistance 816-2 and the collectors of transistors 806-2 and 810-2) is applied through capacitance 828-2 as an input to the base of transistor 802-3 of cascaded Gilbert-cell mixer 800-3a. A second output from Gilbert-cell mixer 800-2a (appearing at the junction of resistance 822-2 and the collectors of transistors 808-2 and 812-2) is applied through capacitance 830-2 as an input to the base of transistor 804-3 of cascaded Gilbert-cell mixer 800-3a. Also, the reference value REF 1 is applied to the interconnected bases of transistors 808-3 and 810-3.

Analog signal S is applied in parallel to the bases of transistors 806-1 and 812-1 of Gilbert-cell mixer 800-1a, to the bases of transistors 806-2 and 812-2 of Gilbert-cell mixer 800-2a, and to the bases of transistors 806-3 and 812-3 of Gilbert-cell mixer 800-3a. The Bit-1 output of the 2-Bit binary code is obtained from the junction of resistance 822-1 and the collectors of transistors 808-1 and 812-1 of Gilbert-cell mixer 800-1a through capacitance 832-1, while the Bit-0 output of the 2-Bit binary code is obtained from the junction of resistance 822-3 and the collectors of transistors 808-3 and 812-3 of Gilbert-cell mixer-800-3a through capacitance 832-3 and phase latch 129-3.

Figure 8B:
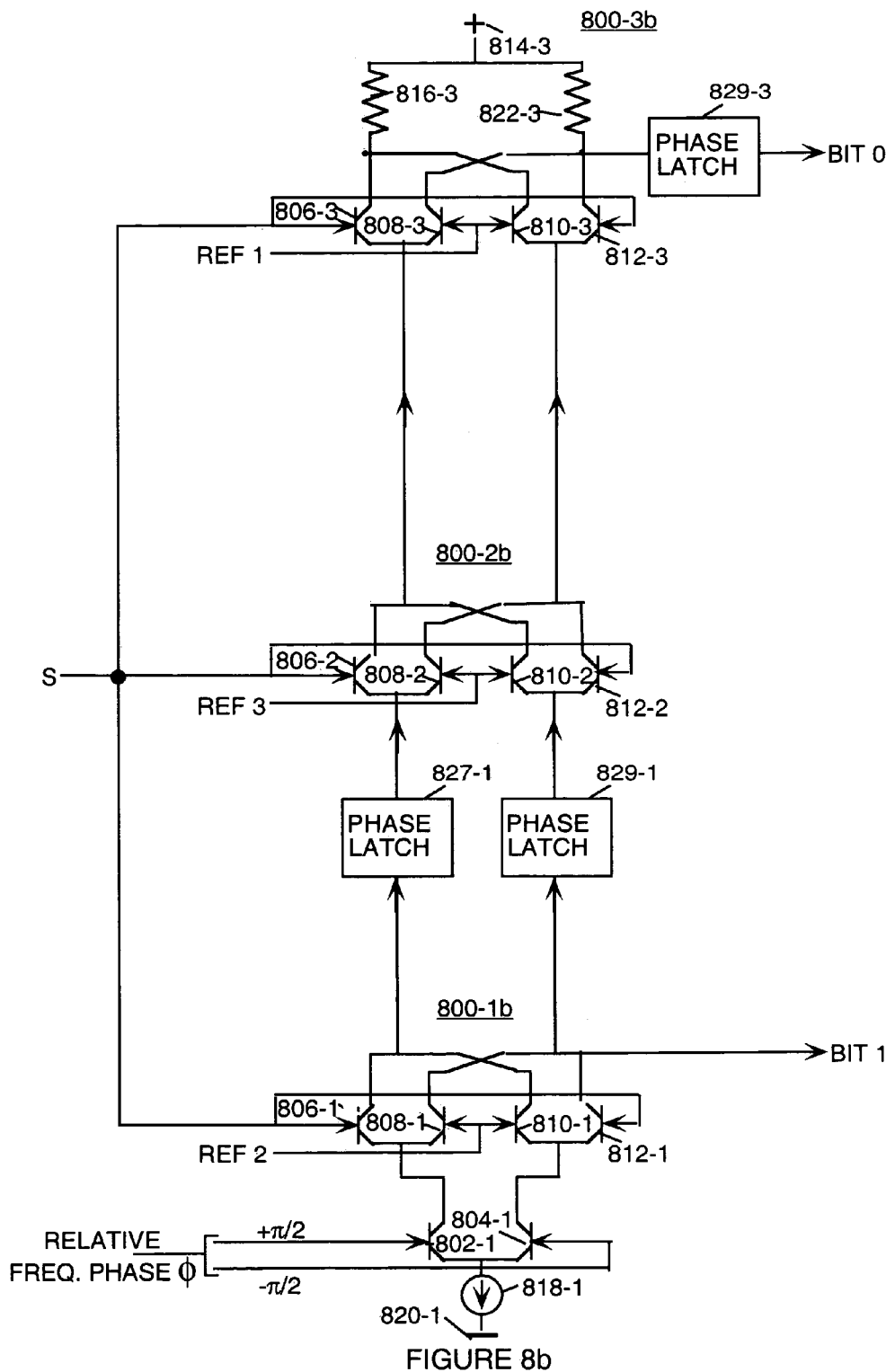

Referring to FIG. 8b, there is shown a schematic diagram of a DC-coupled circuit of cascaded Gilbert-cell mixers, which comprises an alternative implementation of a cascaded column of phase-reversing switches (such as utilized in each of FIGS. 5, 6 and 7). As a particular example, FIG. 8b, shows the DC-coupled circuits for each of cascaded Gilbert-cell mixers 800-1b, 800-2b and 800-3b that together provide the Bit-0 and Bit-1 outputs of a 2-Bit standard binary code. In FIG. 8b, analog signal S, reference values REF 1, REF 2, REF 3 and elements 802-1, 804-1, 806-1, 808-1, 810-1, 812-1, 818-1, 820-1, 827-1, 829-1, 806-2, 808-2, 810-2, 812-2, 806-3, 808-3, 810-3, 812-3, 814-3, 816-3, 822-3 and 829-3 are substantially the same as analog signal S, reference values REF 1, REF 2, REF 3 and those elements of the AC-coupled circuit of cascaded Gilbert-cell mixers described above in connection with FIG. 8a. Thus, the DC-coupled circuit of cascaded Gilbert-cell mixers of FIG. 8b omits elements 816-1, 822-1, 824-1, 826-1, 828-1, 830-1, 832-1 802-2, 802-4, 816-2, 818-2, 820-2, 822-2, 828-2, 830-2, 802-3, 804-3, 818-3, 820-3, 828-2, 830-2 and 832-3 required by the DC-coupled circuit of cascaded Gilbert-cell mixers of FIG. 8a. However, the DC-coupled circuit of 3 cascaded Gilbert-cell mixers shown in FIG. 8b require a significantly higher voltage potential be applied between positive-voltage terminal 814-3 of Gilbert-cell mixer 800-3b and negative-voltage terminal 820-1 of Gilbert-cell mixer 800-1b than the voltage potential required to be applied between the positive-voltage terminal 814 and the negative-voltage terminal 820 of each separate one of the 3 AC-coupled cascaded Gilbert-cell mixers 800-1a, 800-2a 800-3a. Thus, while a 3 DC-coupled cascaded Gilbert-cell mixer circuit may be viable for only a 2-Bit A/D converter implementation of the present invention, it would not be practical for a high N-Bit implementation (even the 3-Bit A/D converter shown in FIG. 5 needs a 7 DC-coupled cascaded Gilbert-cell mixer circuit) that would require a still much higher voltage be applied across the large number of DC-coupled cascaded Gilbert-cell mixers required for an N-Bit implementation of 3 or more Bits.

In FIG. 8b, the Bit 0 output will include a first-valued DC component and the Bit 1 output will include a second-valued DC component different from that of the first-valued DC component. By employing capacitances 832-1 and 832-3 (shown in FIG. 8a) in FIG. 8b, the DC component of the Bit 0 and Bit 1 outputs can be avoided.

FIG. 9, which shows a preferred embodiment the phase latch employed in each of FIGS. 5, 6, 7, 7a, 8a and 8b, comprises an MPL memory element initially disclosed in the aforementioned is U.S. Pat. No. 5,528,175. Shown in FIG. 9 is a first doubly-balanced mixer 900 and a second doubly-balanced mixer 902. A carrier having a relative frequency phase +φ (which may be +π/2 or, alternatively, −π/2) is applied both to a first input 904 of first doubly-balanced mixer 900 and to a first input 906 of second doubly-balanced mixer 900. The signal input to the phase latch, which is at least a burst of a frequency having a phase +π/2 or, alternatively, −π/2, is applied to second input 908 of first doubly-balanced mixer 900. Doubly-balanced mixer 900, operating as a demodulator, derives a D.C. output 610 having a + polarity if inputs 904 and 908 have the same phases and having a − polarity if inputs 904 and 908 have opposite phases. D.C. output 910 is applied as a second input to second doubly-balanced mixer 902. Doubly-balanced mixer 902, operating as a modulator, derives a frequency output 912 having the same relative phase as first input 906 if D.C. output 910 has a + polarity and having an opposite relative phase from first input 906 if D.C. output 910 has a − polarity. Frequency output 912, which constitutes the signal output from the phase latch, is also amplified by amplifier 914 and fed back as second input 908 to first doubly-balanced mixer 900 with the same + or − phase, as the case may be, as that of the signal input to the phase latch. Thus, even if the original signal input to the phase latch is removed, the signal will be continuously circulated by the phase latch, thereby maintaining the signal output frequency from the phase latch with the same frequency phase as that of the original signal input. Only a later signal input to the phase latch having the opposite frequency phase will disrupt this continuous circulation and result in a new signal output frequency from the phase latch having the opposite frequency phase of the this later signal input.

What is claimed is:

1. In an analog-to-digital (A/D) converter, responsive to $2^N-1$ different reference-values REF 1 to REF $2^N-1$ that divide the dynamic range of amplitude-values of an analog signal into $2^N$ intervals, for converting the current amplitude-value of said analog signal S to binary values in accordance with a preselected N-Bit binary code, where N is a plural integer; the improvement wherein said A/D converter comprises:

$2^N-1$ phase-reversing switches, each of which includes 3 input terminals and 1 output terminal;

said phase-reversing switches being arranged between 1 and N columns, with at least one of said columns comprising a plurality of said phase-reversing switches, wherein the output terminal of each phase-reversing switch in said one column except the bottom phase-reversing switch is interconnected to the first input terminal of the immediately following phase-reversing switch in said one column, thereby interconnecting said plurality of said phase-reversing switches in said one column in cascade;

first means for applying a given carrier frequency having a given relative phase φ to the first input terminal of that phase-reversing switch which is situated at the top of each of said 1 and N columns;

second means for applying said analog signal S to the second input terminal of all of said $2^N-1$ phase-reversing switches;

third means for applying a particular configuration of said $2^N-1$ different reference-values REF 1 to REF $2^N-1$ to the third input terminal of the respective $2^N-1$ phase-reversing switches that is determined by said preselected N-Bit binary code so that (1) whenever the amplitude value of the analog signal S reaches a value above the reference value REF applied to any given phase-reversing switch, that given phase-reversing switch will switch to reverse the relative phase at its output terminal from the relative phase at its first input terminal, and (2) consequently cause the switching of the relative phase at the output terminal of each phase-reversing switch that is ordinally situated in a column of phase-reversing switches below that given phase-reversing switch;

whereby, as determined by the preselected binary code, the respective phases at the output terminals of a certain subset of N phase-reversing switches of the $2^N-1$ phase-reversing switches define the binary values of the preselected N-Bit binary code output from said A/D converter.

2. The A/D converter defined in claim 1, wherein:
   said given relative phase φ=−π/2.

3. The A/D converter defined in claim 1, wherein:
   said preselected N-Bit binary code is a standard N-Bit binary code, and
   said cascaded phase-reversing switches are arranged in solely 1 column.

4. The A/D converter defined in claim 3, wherein said standard N-Bit binary code is a 3-Bit binary code, whereby said $2^N-1$ phase-reversing switches comprise 7 phase-reversing switches, and wherein:
   said respective 7 cascaded phase-reversing switches in said one column are situated in descending order from said phase-reversing switch at the top of said 1 column; and
   said particular configuration of said 7 different reference-values REF 1 to REF 7 applied by said third means to the third input terminal of the respective 7 descending-ordered phase-reversing switches, is REF 4, REF 6, REF 2, REF 7, REF 5, REF 3 and REF 1;
   whereby Bit 2 is derived at the output from the seventh of the cascaded phase-reversing switches (situated at the top) of said one column; Bit 1 is derived at the output from the fifth of the cascaded phase-reversing switches of said one column, and Bit 0 is derived at the output from the first of the cascaded phase-reversing switches (situated at the bottom) of said one column.

5. The A/D converter defined in claim 1, wherein:
   said preselected N-Bit binary code is the Gray, or a variant of the Gray.N-Bit binary code;
   said phase-reversing switches are arranged in N separate columns;
   said certain subset of N phase-reversing switches comprise the bottom phase-reversing switch in each of said N separate columns, and
   said particular configuration of different reference-values REF applied to the third input terminal of the respective $2^N-1$ phase-reversing switches is such that only the bottom phase-reversing switch of a single one of said N columns can be switched at a time, thereby reversing its output phase;
   whereby the binary value of only a single Bit of said Gray, or a variant of a Gray.N-Bit binary code output from said A/D converter is changed at a time.

6. The A/D converter defined in claim 5, wherein:
   said preselected N-Bit binary code is a 3-Bit Gray binary code, whereby said $2^N-1$ phase-reversing switches comprise 7 phase-reversing switches and said N columns comprise 3 columns, and wherein:
   the 1st of said 3 columns comprises a 1st, a 2nd, a 3rd and a 4th of said 7 phase-reversing switches that are cascaded in descending order from said 1st, phase-reversing switch at the top of said 1st, column;

the 2nd of said 3 columns comprises a 5th and a 6th of said 7 phase-reversing switches that are cascaded in descending order from said 5th phase-reversing switch at the top of said 2nd column;

the 3rd of said 3 columns comprises only a 7th of said 7 phase-reversing switches, and said particular configuration of said 7 different reference-values REF 1 to REF 7 applied by said third means to the third input terminal of the respective 7 phase-reversing switches is REF 1 to 1st phase-reversing switch, REF 3 to 2nd phase-reversing switch, REF 5 to 3rd phase-reversing switch, REF 7 to 4th phase-reversing switch, REF 2 to 5th phase-reversing switch, REF 6 to 6th phase-reversing switch, REF 4 to 7th phase-reversing switch;

whereby Bit 2 is derived at the output from the seventh of the cascaded phase-reversing switches of said 3rd of said 3 columns; Bit 1 is derived at the output from the sixth of the cascaded phase-reversing switches of said 2nd of said 3 columns, and Bit 0 is derived at the output from the fourth of the cascaded phase-reversing switches of said 1st of said 3 columns.

7. The A/D converter defined in claim 5, wherein:

said preselected N-Bit binary code is a particular 3-Bit variant of the Gray binary code, whereby said $2^N-1$ phase-reversing switches comprise 7 phase-reversing switches and said N columns comprise 3 columns, and wherein:

the 1st of said 3 columns comprises a 1st and a 2nd of said 7 phase-reversing switches that are cascaded in descending order from said 1st, phase-reversing switch at the top of said 1st, column;

the 2nd of said 3 columns comprises a 3rd, a 4th and a 5th of said 7 phase-reversing switches that are cascaded in descending order from said 5th phase-reversing switch at the top of said 2nd column;

the 3rd of said 3 columns comprises a 6th, and a 7th of said 7 phase-reversing switches that are cascaded in descending order from said 5th phase-reversing switch at the top of said 2nd column;

said particular configuration of said 7 different reference-values REF 1 to REF 7 applied by said third means to the third input terminal of the respective 7 phase-reversing switches is REF 1 to 1st phase-reversing switch, REF 5 to 2nd phase-reversing switch, REF 2 to 3rd phase-reversing switch, REF 4 to 4th phase-reversing switch, REF 6 to 5th phase-reversing switch, REF 3 to 6th phase-reversing switch, REF 7 to 7th phase-reversing switch;

whereby Bit 2 is derived at the output from the seventh of the cascaded phase-reversing switches of said 3rd of said 3 columns; Bit 1 is derived at the output from the fifth of the cascaded phase-reversing switches of said 2nd of said 3 columns, and Bit 0 is derived at the output from the second of the cascaded phase-reversing switches of said 1st of said 3 columns.

8. The A/D converter defined in claim 1, further comprising:

delay means coupled to output terminals of said certain subset of N phase-reversing switches to compensate for differences in the number of switch delays that have occurred with respect to each of the outputs from these N phase-reversing switches of said certain subset, thereby resulting in all the binary values of the preselected N-Bit binary code output from said A/D converter occurring isochronously with one another.

9. The A/D converter defined in claim 1, wherein:

each of said $2^N-1$ phase-reversing switches comprises a 4-terminal doubly-balanced mixer; and a phase latch coupled to the output terminal of each doubly-balanced mixer of said certain subset of N phase-reversing switches of the $2^N-1$ phase-reversing switches that define the binary values of the preselected N-Bit binary code output from said A/D converter.

10. The A/D converter defined in claim 9, wherein:

each 4-terminal doubly-balanced mixer comprises a Gilbert-cell mixer.

11. The A/D converter defined in claim 10, wherein:

said plurality of said phase-reversing switches in said one column that are interconnected in cascade comprise a plurality of Gilbert-cell mixers interconnected in cascade.

12. The A/D converter defined in claim 11, wherein:

said plurality of Gilbert-cell mixers interconnected in cascade are AC-coupled to one another.

* * * * *